United States Patent
Babic et al.

(10) Patent No.: US 11,102,916 B2
(45) Date of Patent: *Aug. 24, 2021

(54) ELECTRIC POWER INVERTER

(71) Applicant: Mahle International GmbH, Stuttgart (DE)

(72) Inventors: Gregor Babic, Videm-Dobrepolje (SI); Jurij Podrzaj, Ig (SI); Ambroz Vrtovec, Sempas (SI)

(73) Assignee: Mahle International GmbH

( * ) Notice: Subject to any disclaimer, the term of this patent is extended or adjusted under 35 U.S.C. 154(b) by 0 days.

This patent is subject to a terminal disclaimer.

(21) Appl. No.: 16/533,746

(22) Filed: Aug. 6, 2019

(65) Prior Publication Data

US 2020/0052609 A1    Feb. 13, 2020

(30) Foreign Application Priority Data

Aug. 7, 2018   (EP) .................................... 18187799

(51) Int. Cl.
*H05K 7/00*    (2006.01)
*H05K 7/20*    (2006.01)
(Continued)

(52) U.S. Cl.
CPC .......... *H05K 7/209* (2013.01); *H01L 23/367* (2013.01); *H02K 11/33* (2016.01); *H02M 7/003* (2013.01);
(Continued)

(58) Field of Classification Search
USPC ........................................................ 361/728
See application file for complete search history.

(56) References Cited

U.S. PATENT DOCUMENTS 5,786,989 A     7/1998  Kawabe
7,292,451 B2 *  11/2007  Rodriguez ............ H02M 7/003
                                                  361/775
(Continued)

FOREIGN PATENT DOCUMENTS

EP    2 535 587 A1    12/2012
JP    2009-043775 A    2/2009
(Continued)

OTHER PUBLICATIONS

English abstract for JP-2014-236661-A.
English abstract for JP-2009-043775-A.

*Primary Examiner* — Hung S. Bui
(74) *Attorney, Agent, or Firm* — Fishman Stewart PLLC

(57) ABSTRACT

An electric power inverter for an electrical machine of an electrically powered drive system may include a capacitor board including a plurality of capacitors and at least one semiconductor board including a plurality of power semiconductors. The capacitor board and the at least one semiconductor board may be electrically interconnected and mutually stacked in a stacking direction, with a clearance, in a stack formation. The plurality of capacitors may be arranged on the capacitor board and fitted to a side thereof facing the at least one semiconductor board. At least one open location space may be defined between the plurality of capacitors and the capacitor board. The at least one open location space may be configured to accommodate the at least one semiconductor board. The at least one semiconductor board may be arranged within the at least one open location space with a clearance to the capacitor board.

20 Claims, 8 Drawing Sheets

(51) Int. Cl.
  *H02K 11/33*    (2016.01)
  *H02M 7/00*     (2006.01)
  *H01L 23/367*   (2006.01)
  *H05K 1/02*     (2006.01)
  *H05K 1/14*     (2006.01)

(52) U.S. Cl.
  CPC .......... *H05K 1/0204* (2013.01); *H05K 1/144* (2013.01); *H05K 2201/042* (2013.01); *H05K 2201/10015* (2013.01)

(56) References Cited

U.S. PATENT DOCUMENTS

| | | | |
|---|---|---|---|
| 9,318,935 B2 * | 4/2016 | Nakagami | ............ F04C 23/008 |
| 2008/0186681 A1 | 8/2008 | Deck et al. | |
| 2020/0052605 A1 * | 2/2020 | Babic | ................... H05K 1/0204 |
| 2020/0052610 A1 * | 2/2020 | Babic | ..................... H05K 7/209 |

FOREIGN PATENT DOCUMENTS

| | | | | |
|---|---|---|---|---|
| JP | 2014-236661 A | | 12/2014 | |
| JP | 2014236660 | * | 12/2014 | ............ H02K 11/00 |

* cited by examiner

ELECTRIC POWER INVERTER

CROSS-REFERENCE TO RELATED APPLICATION

This application claims priority to European Patent Application No. EP 18187799.4, filed on Aug. 7, 2018, the contents of which are hereby incorporated by reference in its entirety.

TECHNICAL FIELD

The invention relates to an electric power inverter for an electrical machine of an electrically powered drive system. The invention also relates to an electrical machine comprising said electric power inverter.

BACKGROUND

In a generic electric power inverter, a direct current is converted into a poly-phase alternating current. The electric power inverter can be employed for the driving of an electrical machine of an electrically powered drive system, wherein direct current is drawn from a power source, converted into an alternating current, and fed to the electrical machine. The electrical machine can be a permanently-excited or externally-excited synchronous machine, an asynchronous machine or another type of electrical machine. For the conversion of a direct current into an alternating current, the electric power inverter generally incorporates a capacitor board having a plurality of capacitors, and at least one semiconductor board having a plurality of power semiconductors, which are electrically interconnected. Furthermore a control board is provided for controlling the switching operations of the semiconductors. During the operation of the electric power inverter there are power loses, which result in a substantial quantity of heat being generated, and it is necessary for both the capacitors and the power semiconductors to be cooled. It should be noted that such an inverter can also be operated in a reverse mode to convert an alternating current into a direct current so that the electrical machine can function as a generator and supply electrical energy back to a battery.

The generic electric power inverter is suitable for use in an electrical machine, and may be subject to in-service vibration or oscillation or other environmental influences and operating conditions. The capacitors are commonly soldered to the capacitor board, wherein soldered joints and the wires connections to the capacitors are relatively rigid and brittle and also prone to breaking. As a result of vibrations, oscillations or relative movements between the capacitor board and the semiconductor board, the soldered joints and wire connections can easily break, thus resulting in the failure of the electric power inverter. Moreover, the capacitors have a substantial weight, which can also adversely affect the soldered joints. In the design of the electric power inverter, specific consideration must therefore be given to the soldered contacts between the capacitors and the capacitor board and the strength of the wires. Additionally, the height of capacitors can be relatively large, thus disadvantageously increasing the overall height of the electric power inverter.

SUMMARY

The object of the invention is therefore to provide an improved, or at least an alternative embodiment of an electric power inverter of the generic type, in which the above-mentioned disadvantages are overcome.

According to the invention, this object is fulfilled by the subject matter of the independent claim(s). Advantageous forms of embodiment are described in the dependent claim(s).

In a generic electric power inverter for an electrical machine of an electrically powered drive system, the present invention is based upon the general consideration of the mutual mechanical dissociation of a capacitor board having a plurality of capacitors and at least one semiconductor board having a plurality of power semiconductors. The capacitor board and the at least one semiconductor board are mutually stacked in a stacking direction, with a clearance, in a stack formation, and are mutually electrically interconnected. According to the invention, a plurality of capacitors are arranged on the capacitor board in the stacking direction, and are attached to a side thereof facing the at least one semiconductor board. The plurality of capacitors are arranged on the capacitor board to form at least one open location space between the capacitors and the capacitor board, positioned to accommodate a respective one of the at least one semiconductor board, and the at least one semiconductor board is arranged within the respective location space, with a clearance to the capacitor board.

The capacitors are arranged on the capacitor board and contacted thereto with contact pins—generally soldered thereto—and are oriented in the stacking direction. Orientation of the capacitors in the stacking direction signifies that a longitudinal axis of the respective capacitor is arranged in parallel with the stacking direction. If the respective capacitor has a cylindrical capacitor body, the longitudinal axis of the respective capacitor corresponds to a longitudinal axis of the cylindrical capacitor body. The open location space is formed by the capacitors which are oriented in the stacking direction and is radially delimited, at least in parts, by the capacitors, and delimited on one side in the stacking direction by the capacitor board. The at least one semiconductor board is arranged within the location space, with a clearance to the capacitor board and, at least in parts, is radially enclosed by the capacitors. The capacitors on the capacitor board thus assume no direct or immediate contact with the at least one semiconductor board, and are mechanically dissociated from the latter accordingly. Accordingly, oscillations of the at least one semiconductor board occurring during the operation of the electric power inverter cannot be transmitted to the capacitors, and the—generally soldered—contact pins of the capacitors with the capacitor board can be protected against breakage. Moreover, the structural height of the stack formation comprised of the at least one semiconductor board and the capacitor board corresponds to the height of the capacitor board with its capacitors, and is advantageously reduced, in comparison with a conventional electric power inverter.

It can be provided, that the generic electric power inverter contains a single semiconductor board. In this case, the capacitors can be arranged in the edge region of the capacitor board, wherein the edge region extends radially to the stacking direction, on a circumferential edge of the capacitor board. The location space is then radially delimited by the capacitors, and delimited on one side in the stacking direction by the capacitor board. It can also be provided, that the generic electric power inverter contains more than one semiconductor board. On the capacitor board, the several open location spaces are then formed for the respective semiconductor boards.

In a further development of the electric power inverter according to the invention, it is provided that a maximum width of the at least one semiconductor board is smaller than the difference between a width of the capacitor board and two times the width of the individual capacitor. Alternatively, or additionally, a maximum length of the at least one semiconductor board can be smaller than the difference between a length of the capacitor board and two times the length of an individual capacitor. The maximum width and the maximum length of the at least one semiconductor board are thus achieved if the capacitors are arranged radially to the stacking direction, in a single row, in the edge region of the capacitor board. In a capacitor with a cylindrical capacitor body, the width and the length thereof correspond to the diameter of the cylindrical capacitor body.

Advantageously, it can be provided that the capacitor board and the at least one semiconductor board are mutually electrically bonded by means of at least two connecting busbars. The at least two connecting busbars are arranged in the location space between the capacitor board and the at least one semiconductor board, and maintain the clearance between the at least one semiconductor board and the capacitor board. The connecting busbars can extend over virtually the entire length or over virtually the entire width of the at least one semiconductor board, and can be configured in a mutually parallel arrangement. Advantageously, a defined clearance is thus achieved between the capacitor board and the at least one semiconductor board, without additional means. Moreover, the structural height of the stack formation comprised of the capacitor board and the at least one semiconductor board shows no change from the height of the capacitor board with its capacitors.

Additionally, an electrically-insulating busbar guide plate can be stacked in the stack formation of the electric power inverter in the stacking direction, and arranged in the location space adjacently to the capacitor board and the at least one semiconductor board. In the stacking direction, the busbar guide plate thus cooperates on one side with the capacitor board and on the other side with the at least one semiconductor board, and maintains a fixed mutual clearance between the latter. The at least two connecting busbars, perpendicularly to the stacking direction and the busbar guide plate, can be fitted to the latter in a penetrative manner. To this end, the busbar guide plate can incorporate at least two full-thickness slot openings, in which the respective connecting busbars are arranged to penetrate the busbar guide plate. The busbar guide plate prevents any tilting or slipping of the connecting busbars on the capacitor board and the at least one semiconductor board, and ensures the maintenance of electrical contact between the capacitor board and the at least one semiconductor board. The busbar guide plate ensures also the position of the capacitor board and the at least one semiconductor board over lifetime and over assembly process.

The power semiconductors on the at least one semiconductor board can constitute a power circuit with at least one phase terminals which, by means of a respective phase terminal stud, extends to the capacitor board in the stacking direction and is brought out to the exterior through the stack formation. In this manner, the at least one semiconductor board can be electrically bonded to the exterior, and an alternating current generated in the electric power inverter can be tapped-off. The respective phase terminal studs can penetrate the stack formation—comprised of the capacitor board and further boards stacked on the capacitor board in a stack formation—through one phase terminal opening respectively. The respective phase terminal studs can further incorporate, perpendicularly to the stacking direction, a limit stop which is integrally formed on the phase terminal studs, and is arranged between the capacitor board and the at least one semiconductor board. On the limit stop, the capacitor board, in an area which incorporates the respective phase terminal opening, engages with the at least one semiconductor board, and is thus supported with a clearance thereto. In this manner, even in the event of vibrations or oscillations, the at least one semiconductor board cannot inadvertently be brought into direct contact with the capacitor board, and a short-circuit is prevented.

The capacitors on the capacitor board can constitute a capacitor circuit, with a positive pole terminal and a negative pole terminal. The positive pole terminal and the negative pole terminal, by means of a respective power terminal stud, averted from the at least one semiconductor board in the stacking direction, are brought out to the exterior through the stack formation. The electric power inverter can be supplied with a direct current from an external component, via the power terminal studs. The respective power terminal studs can penetrate the stack formation—i.e. further boards stacked on the capacitor board in a stack formation—through one power terminal opening respectively.

Advantageously, it is provided that a control board is stacked in the stack formation of the electric power inverter, in the stacking direction, averted from the at least one semiconductor board and arranged on the capacitor board. The control board can control the electric power inverter and, for the purposes of signal transmission, can be connected to an external component via a line terminal. Appropriately, the control board can incorporate phase terminal openings and power terminal openings, through which the respective phase terminal studs and the respective power terminal studs penetrate the control board, and are brought out to the exterior.

In order to cool the stack formation, a thermally-conductive heat exchanger plate can be arranged on the at least one semiconductor board, averted from the capacitor board. The heat exchanger plate can constitute part of the housing of the electrical machine, or part of the electrical machine itself. The heat exchanger plate is preferably comprised of a thermally high conductive material, more preferably of aluminium, and can be coupled to the at least one semiconductor board in a large-surface thermally-conductive manner. To this end, the heat exchanger plate, at least in certain areas, can be arranged in the location space, adjacently to the at least one semiconductor board. In this manner, heat generated in the power semiconductors can be evacuated to the exterior, and the at least one semiconductor board can be cooled. In this embodiment, the location space, radially to the stacking direction, is delimited at least in certain areas by the capacitors of the capacitor board and, in the stacking direction, is closed on one side by the capacitor board and on the other side by the heat exchanger plate. The at least one semiconductor board, the at least two connecting busbars and the busbar guide plate can then be arranged in the location space.

Alternatively or additionally, the capacitors of the capacitor board can also be coupled to the heat exchanger plate in a thermally-conductive manner. To this end, the heat exchanger plate can preferably incorporate capacitor contact sections, which are coupled to the respective capacitor, radially to the stacking direction. The capacitor contact sections can accommodate the capacitors, at least in certain areas, radially to the stacking direction and, in this manner, form a large-surface coupling with the heat exchanger plate. The capacitors are thus in contact with the heat exchanger plate, and are not attached to the latter, such that the capacitors are displaceable on the heat exchanger plate in the stacking direction, and are radially mechanically dissociated from the latter. Specifically, in this manner, the—generally soldered—contact pins of the capacitors on the capacitor board are protected against breakage in the event of the occurrence of vibrations or oscillations during the operation of the electric power inverter.

Alternatively or additionally, the capacitors on the capacitor board can be axially coupled to the heat exchanger plate by means of an elastic layer, preferably by means of a silicone foam. In this manner, the capacitors are axially in contact with the heat exchanger plate, and are not attached to the latter, such that the capacitors are displaceable on the heat exchanger plate in the stacking direction, and are axially mechanically dissociated from the latter. Thus, the—generally soldered—contact pins of the capacitors on the capacitor board are protected against breakage in the event of the occurrence of vibrations or oscillations during the operation of the electric power inverter.

In order to improve thermal conduction, the at least one semiconductor board and the capacitors on the capacitor board can be coupled to the heat exchanger plate in a thermally-conductive manner by means of a heat-conducting layer. The heat-conducting layer is preferably a thermally-conductive paste, which is applied between the heat exchanger plate and the at least one semiconductor board, and to the capacitors on the capacitor board. Alternatively or additionally, the heat exchanger plate can incorporate a plurality of cooling ribs, which are formed on an outer side which is averted from the at least one semiconductor board, preferably perpendicularly to the stacking direction. Moreover, a cooling device can be provided, which is coupled to an outer side of the heat exchanger plate which is averted from the at least one semiconductor board, in a thermally-conductive manner. The heat exchanger plate can then evacuate heat to a cooling medium in the cooling device and, in this manner, both the at least one semiconductor board and the capacitors can be cooled.

In a further development of the electric power inverter according to the invention, a pressure plate is stacked in the stack formation of the electric power inverter, in the stacking direction, and is arranged on the capacitor board, averted from the at least one semiconductor board. The capacitor board and the at least one semiconductor board can then be clamped between the pressure plate and the heat exchanger plate, in the stacking direction. In order to reduce vibrations in the stack formation, and to reduce relative movements between the pressure plate, the capacitor board and the at least one semiconductor board, an elastic damping plate can be stacked in the stack formation of the electric power inverter, in the stacking direction, and arranged between the pressure plate and the capacitor board. The damping plate damps relative movements between the capacitor board and the at least one semiconductor board, such that secure electrical contact is maintained between the capacitor board and the at least one semiconductor board. The damping plate also compensates the small movements between the capacitor board and the at least one semiconductor board correlated to the TCE (TCE: Thermal Coefficient of Expansion) mismatch. The control board can be arranged on the pressure plate in the stack formation, averted from the damping plate. Appropriately, the phase terminal studs, via the respective phase terminal openings, and the power terminal studs, via the respective power terminal openings, can penetrate the damping plate, the pressure plate and the control board.

Moreover, the capacitor board and the at least one semiconductor board, by means of the pressure plate, the damping plate and the heat exchanger plate, can be compressed together in the stacking direction, and mutually electrically bonded by pressure contact. To this end, the pressure plate can be screwed to the heat exchanger plate through the stack formation such that, as a result of the elastic damping plate, pressure is generated between the pressure plate and the heat exchanger plate in the stacking direction. By means of the connecting busbars, the busbar guide plate and the limit stops of the phase terminal studs, the at least one semiconductor board is thus maintained with a fixed clearance to the capacitor board, thus preventing an unwanted short-circuit between the at least one semiconductor board and the capacitor board. Moreover, by this arrangement, any unwanted oscillation of the at least one semiconductor board and the capacitor board in the stack formation can be prevented. The capacitors thus remain exclusively mechanically coupled to the capacitor board such that, regardless of any pressure generated by vibrations or oscillations during the operation of the electric power inverter, the—generally soldered—contact pins of the capacitors on the capacitor board are protected against breakage.

Advantageously, the electric power inverter can incorporate an electrically-insulating housing cover, which is detachably arranged on the heat exchanger plate, and encloses the stack formation to the level of the heat exchanger plate. The stack formation is thus arranged between the heat exchanger plate and the housing cover, and is protected against external influences. The housing cover can incorporate terminal openings for the respective phase terminal studs and for the respective power terminal studs, such that the at least one semiconductor board and the capacitor board are electrically contactable to the exterior. The housing cover can be made out of electrical insulating material or of metal with an electrical insulation around the terminals studs. The housing cover can further incorporate a line terminal opening for the line terminal of the control board, via which the control board is connectable to an external component for the purposes of signal transmission. In order to permit pressure equalization, the housing cover can incorporate a pressure equalization opening with a membrane, preferably of polytetrafluoroethylene.

Advantageously, the electric power inverter can be arranged radially or axially on an electrical machine which is suitable for use in an electrically powered drive system. In this context, the terms "axial" and "radial" refer to a drive shaft of the electrical machine, the longitudinal axis or axis of rotation of which is parallel to the stacking direction of the electric power inverter, in the axial arrangement, and perpendicular thereto, in the radial arrangement. The electrical machine can be a permanently-excited or externally-excited synchronous machine, an asynchronous machine or another type of electrical machine. The electrical machine can be for example an electrical pump, an electrical compressor, an electrical powered steering and so on.

In summary, the capacitors on the capacitor board are mechanically dissociated from the remainder of the stack formation, such that no relative movements in the stack formation can be transmitted to the capacitors. The generally soldered—and therefore rigid and brittle—contact pins of the capacitors with the capacitor board are thus protected against breakage, and any failure of the contact pins is advantageously prevented. Both the capacitors and the at least one semiconductor board can be effectively cooled by means of the heat exchanger plate, and any overheating of the electric power inverter can be advantageously prevented.

Moreover, the electric power inverter according to the invention is of a comparatively flat design.

The invention further relates to an electrical machine with an electric power inverter, which is arranged axially or radially on the electrical machine. According to the invention, the electric power inverter is configured as described above. The electrical machine can be a permanently-excited or externally-excited synchronous machine, an asynchronous machine or another type of electrical machine which is suitable for use in an electrically powered drive system. In this context, the terms "axial" and "radial" refer to a drive shaft of the electrical machine, the longitudinal axis or axis of rotation of which is parallel to the stacking direction of the electric power inverter, in the axial arrangement, and perpendicular thereto, in the radial arrangement.

Further important characteristics and advantages of the invention proceed from the sub-claims, from the drawings, and from the associated description of the figures, which refers to the drawings.

It is understood that the above-mentioned characteristics, and those described hereinafter, can not only be applied in the respective combination indicated, but also in other combinations, or in isolation, without departing from the scope of the present invention.

Preferred exemplary embodiments of the invention are represented in the drawings and are described in greater detail in the following description, wherein the same reference symbols refer to identical, similar, or functionally equivalent components.

BRIEF DESCRIPTION OF THE DRAWINGS

Herein, schematically in each case

DETAILED DESCRIPTION

Figure 1:
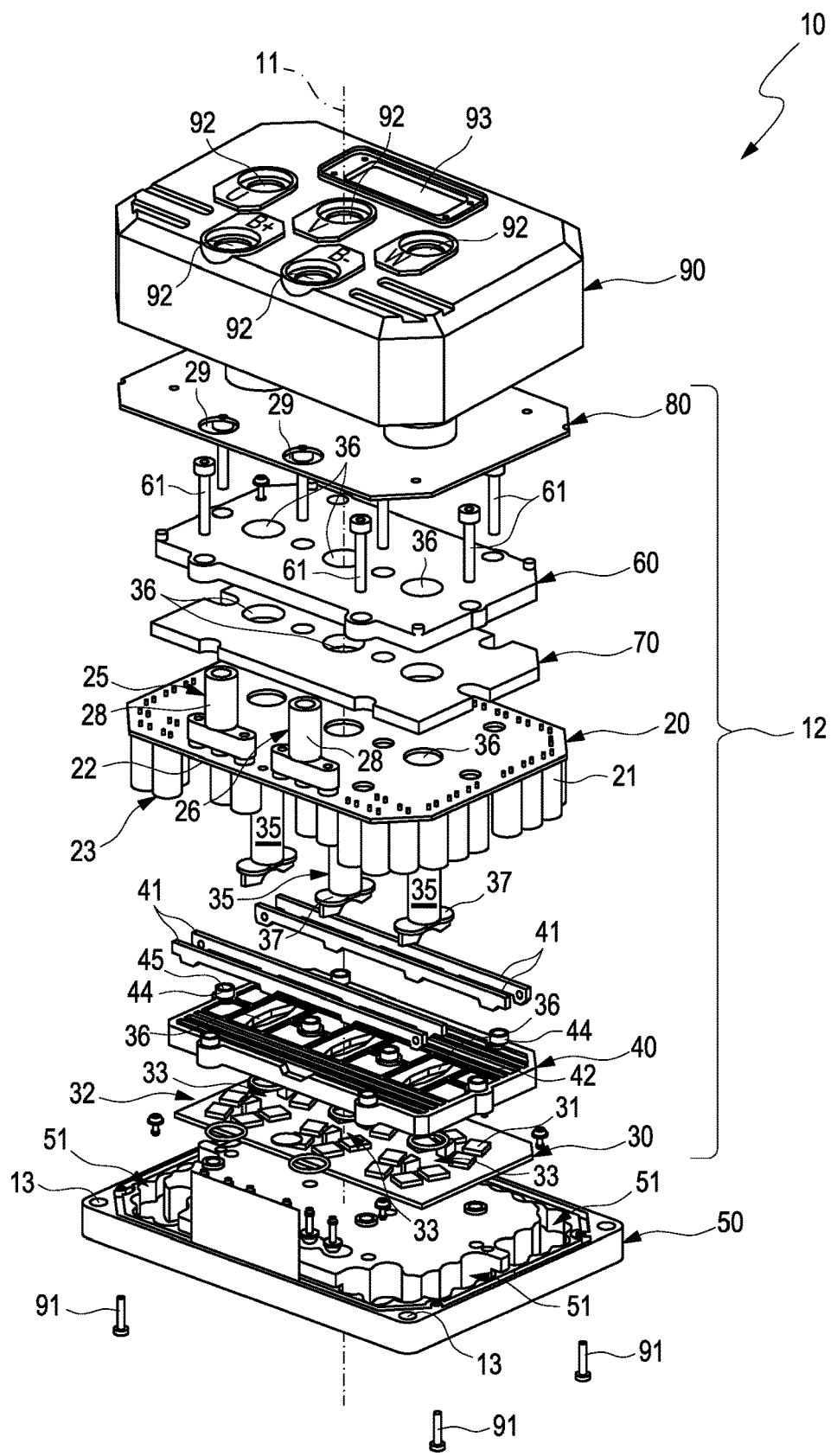
FIG. 1 shows an exploded view of an electric power inverter according to the invention in a first embodiment.
Figure 2:
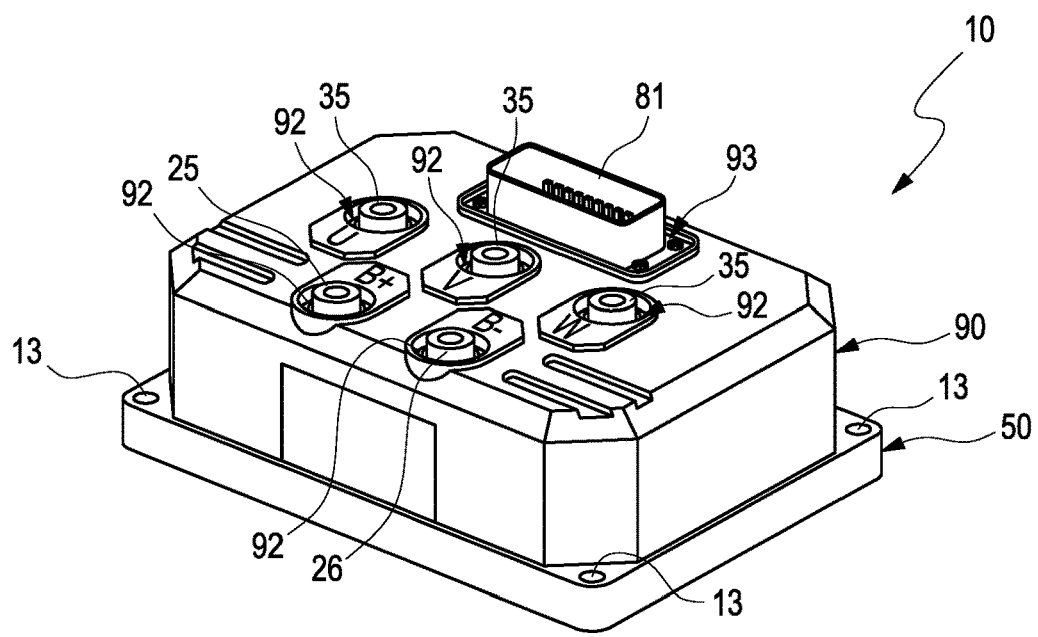
FIG. 2 shows a view of an electric power inverter in the first embodiment.
Figure 4:
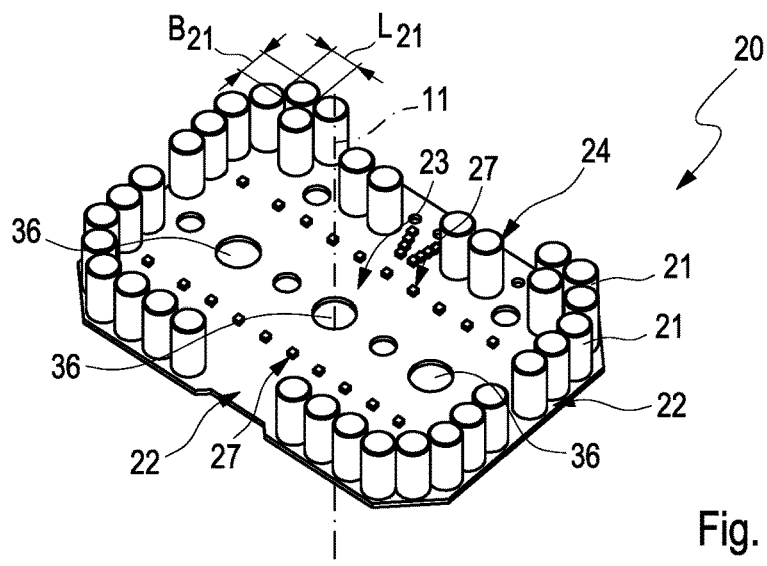
FIGS. 4 and 5 show views of a capacitor board with a plurality of capacitors, in an electric power inverter in the first embodiment.
Figure 5:
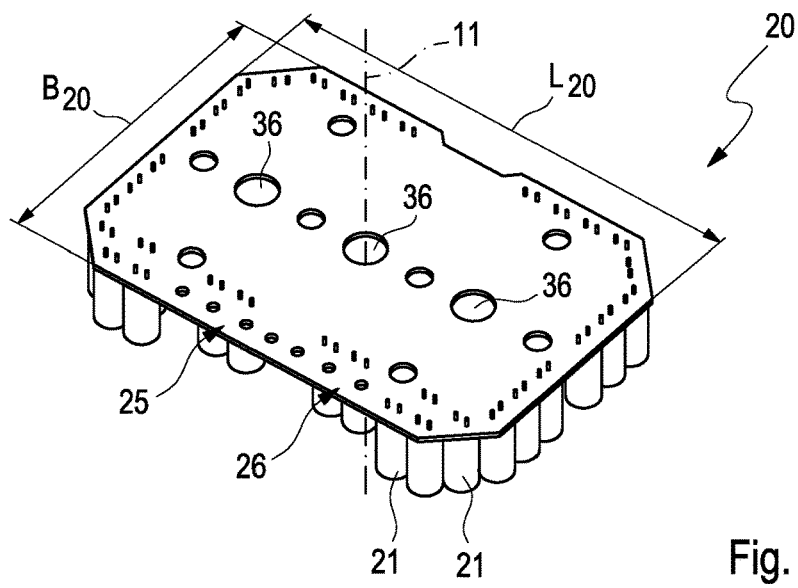

FIG. 1 shows an exploded view and FIG. 2 shows a view of an electric power inverter 10 according to the invention in a first embodiment. The electric power inverter 10 incorporates a capacitor board 20 having a plurality of capacitors 21, and a semiconductor board 30 having a plurality of power semiconductors 31, which are represented in detail in FIGS. 4 to 6. The capacitor board 20 and the semiconductor board 30 are mutually stacked in a stacking direction 11, with a clearance, in a stack formation 12. The plurality of capacitors 21 are arranged on the capacitor board 20 in the stacking direction 11, and are fitted to a side thereof facing the semiconductor board 30, in an edge region 22 of the capacitor board 20, as also represented in FIGS. 4 and 5. The plurality of capacitors 21 thus form an open location space 23 between the capacitors 21 and the capacitor board 20, centrally positioned to the semiconductor board 30. The semiconductor board 30 is arranged within this location space 23, and is enclosed by the capacitors 21, radially to the stacking direction 11. A maximum width $B_{30}$ of the semiconductor board 30 is smaller than the difference between a width $B_{20}$ of the capacitor board 20 and a double width $B_{21}$—in this case double the diameter—of an individual capacitor 21. Here again, a maximum length $L_{30}$ of the semiconductor board 30 is smaller than the difference between a length $L_{20}$ of the capacitor board 20 and a double length $L_{21}$—in this case double the diameter—of the individual capacitor 21.

Figure 9:
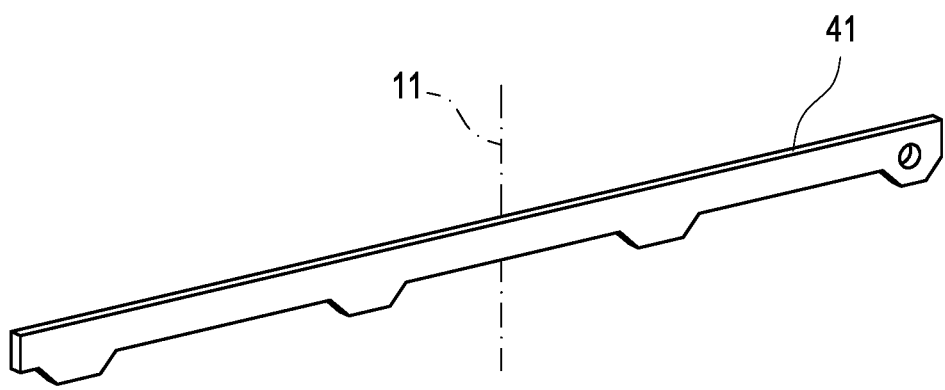
FIG. 9 shows a view of a connecting busbar in an electric power inverter in the first embodiment.

The capacitor board 20 and the semiconductor board 30 are mutually electrically bonded by means of a total of four connecting busbars 41 of identical design. The connecting busbars 41 are arranged in the location space 23 between the capacitor board 20 and the semiconductor board 30, and maintain the clearance between the semiconductor board 30 and the capacitor board 20. The connecting busbars 41 extend over virtually the entire length $L_{30}$ of the semiconductor board 30, and are configured in a mutually parallel manner. FIG. 9 represents one of the connecting busbars 41 of identical design, shown in detail.

Figure 6:
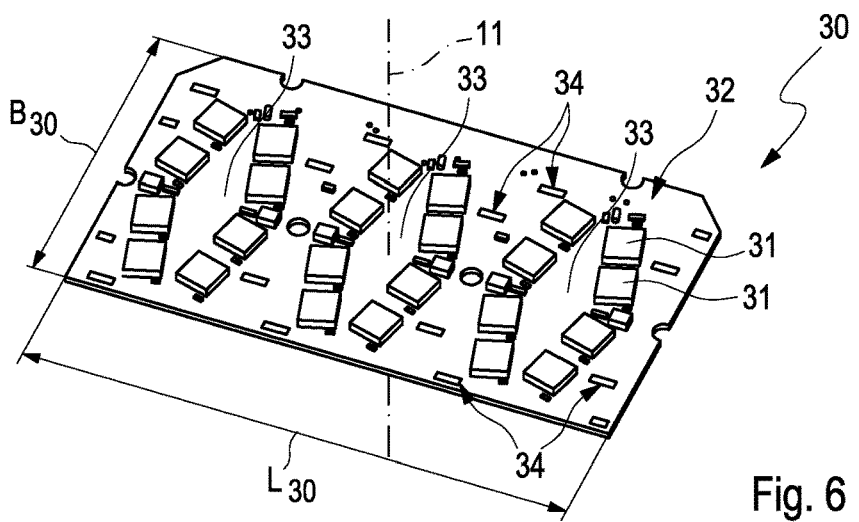
FIG. 6 shows a view of a semiconductor board with a plurality of power semiconductors in an electric power inverter in the first embodiment.

The capacitors 21 constitute a capacitor circuit 24 on the capacitor board 20, as also represented in FIG. 4 and FIG. 5. The capacitor circuit 24 can be externally supplied with a direct current via a positive pole terminal 25 and a negative pole terminal 26, and the connecting busbars 41 provide the mutual electrical bonding of the capacitor circuit 24 and the semiconductor board 30, by means of the busbar terminals 27. The power semiconductors 31 constitute a power circuit 32 on the semiconductor board 30, with three phase terminals 33, as also represented in FIG. 6. By means of the phase terminals 33, the semiconductor board 30 is externally contactable, and the connecting busbars 41 provide the mutual electrical bonding of the power circuit 32 and the capacitor circuit 24, via the busbar terminals 34.

Figure 10:
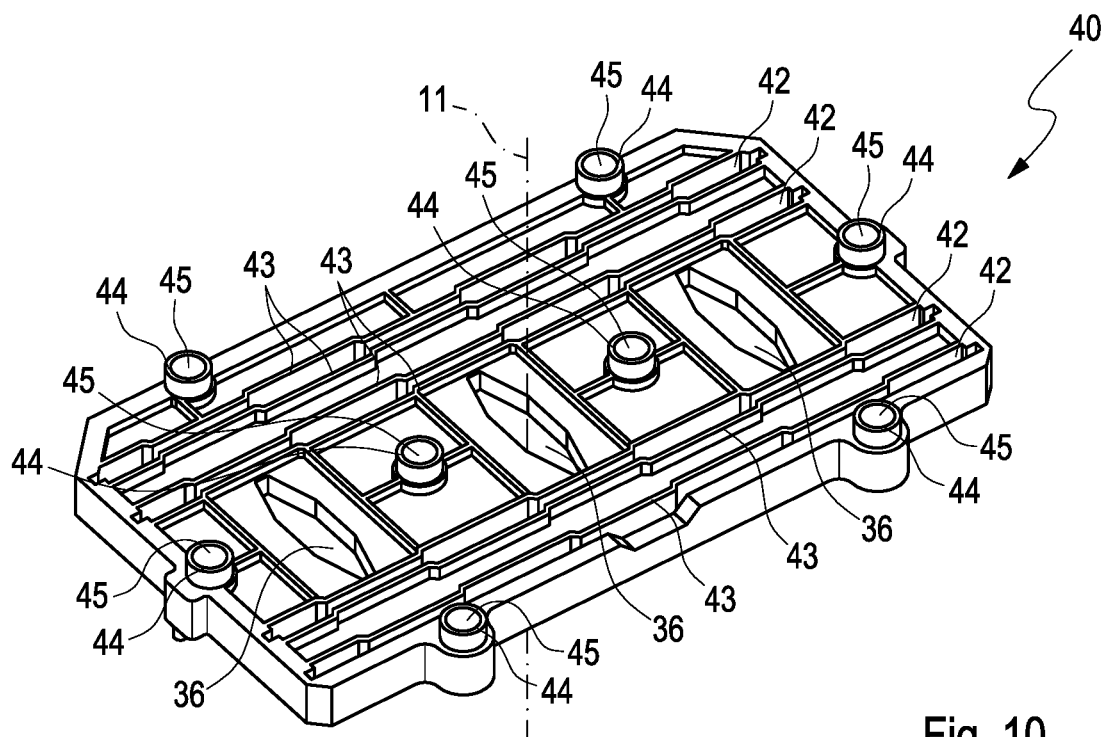
FIGS. 10 and 11 show views of a busbar guide plate in an electric power inverter in the first embodiment.
Figure 11:
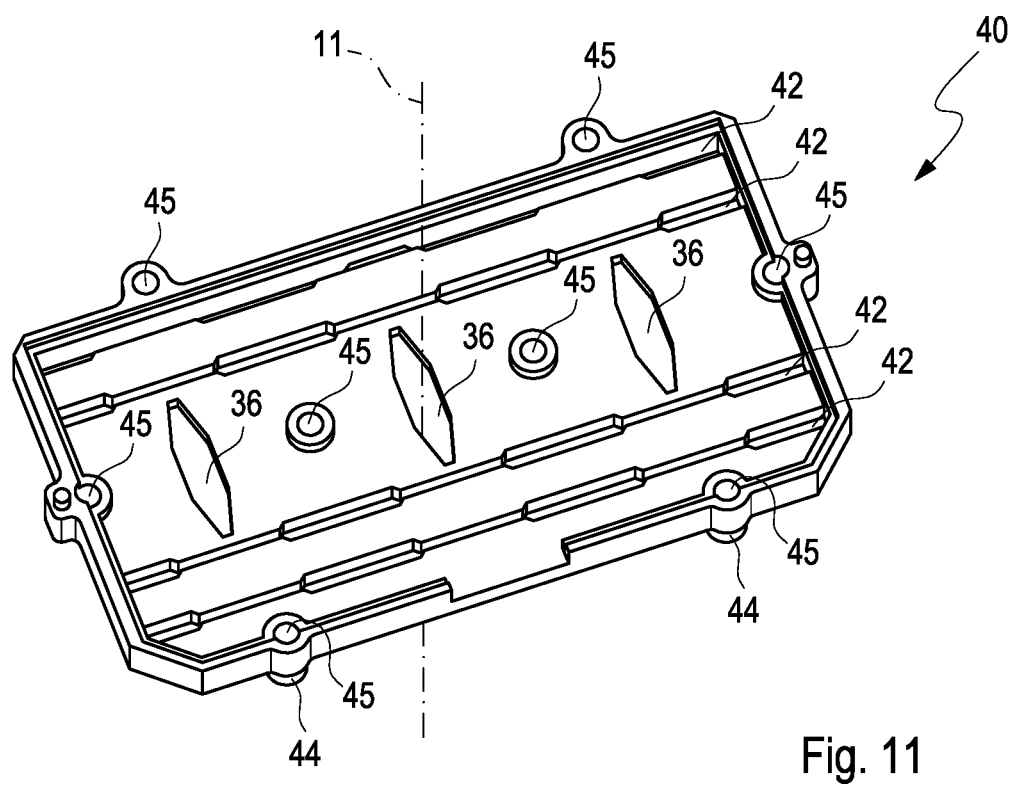

According to FIG. 1, an electrically-insulating busbar guide plate 40 is stacked in the stack formation 12 of the electric power inverter 10 in the stacking direction 11, and arranged between the capacitor board 20 and the semiconductor board 30. In the location space 23, the busbar guide plate 40 cooperates with the capacitor board 20 and the semiconductor board 30, and maintains a fixed mutual clearance between the latter. As also shown in FIG. 10 and FIG. 11, the busbar guide plate 40 incorporates a plurality of full-thickness slot openings 42 for the connecting busbars 41, which penetrate the busbar guide plate 40 in the stacking direction 11, and are arranged in the latter. To this end, the slot openings 42 incorporate supporting edges 43, oriented in the stacking direction 11, on which the connecting busbars 41 are supported on both sides. By this arrangement, any tilting of the connecting busbars 41 in the busbar guide plate 40 can be prevented, and the secure electrical contact of the capacitor board 20 and the semiconductor board 30 is maintained.

The semiconductor board 30 has no direct contact with the capacitors 21 on the capacitor board 20, such that any relative movements or oscillations between the capacitor board 20 and the semiconductor board 30 occurring during the operation of the electric power inverter 10 are not transmitted to the capacitors 21. Specifically, the—generally soldered and thus relatively brittle and rigid—contact pins of the capacitors 21 on the capacitor board 20 are protected against breakage accordingly. Moreover, the structural height of the stack formation 12 is reduced, such that the electric power inverter 10 is of a space-saving design.

Figure 3:
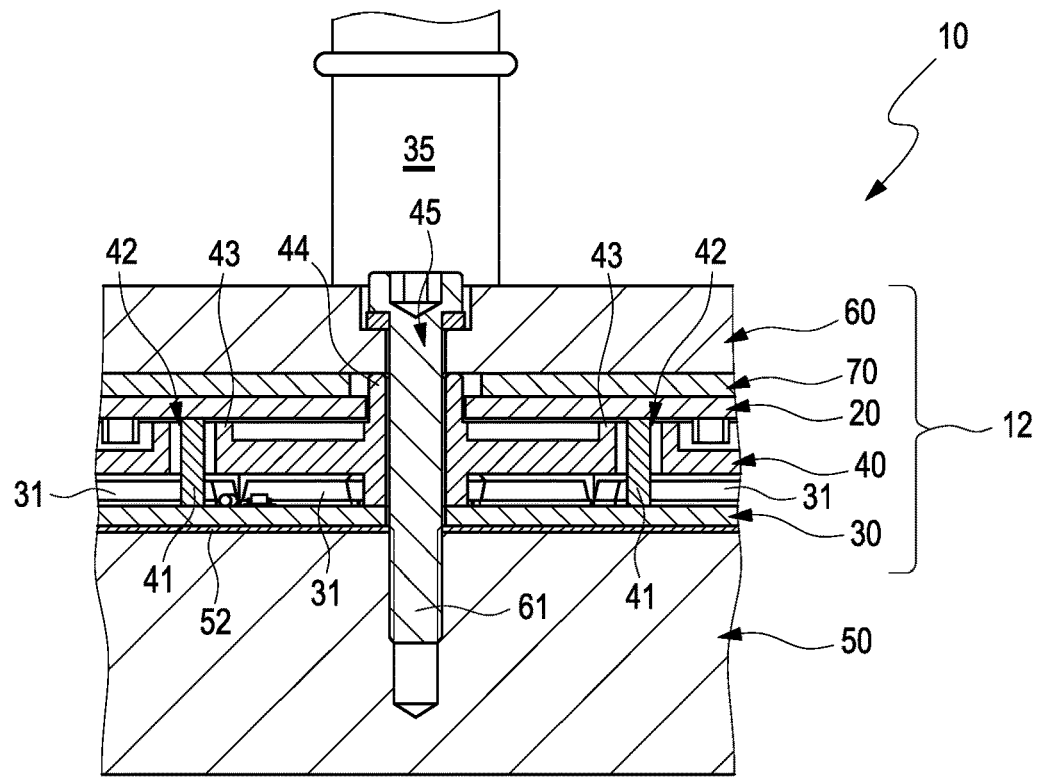
FIG. 3 shows a sectional view of an electric power inverter in the first embodiment.
Figure 12:
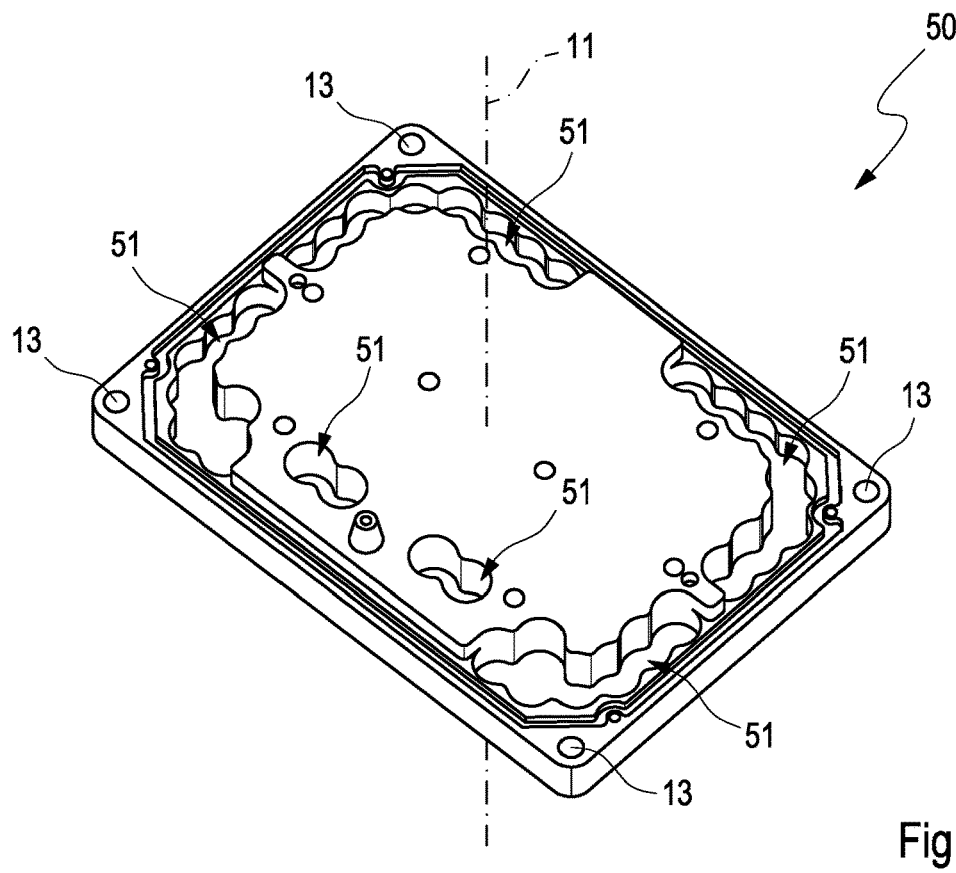
FIGS. 12 and 13 show views of a heat exchanger plate in an electric power inverter in the first embodiment
Figure 13:
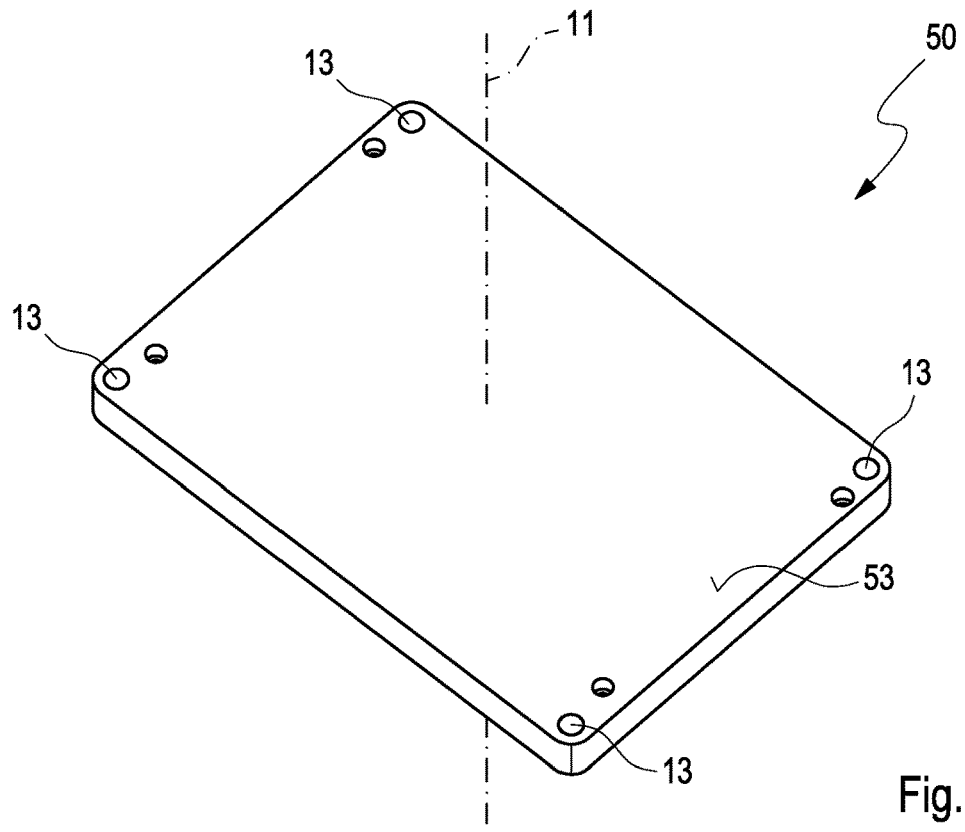

A thermally-conductive heat exchanger plate 50—preferably of a thermally high conductive material, more preferably of aluminium—is arranged on the semiconductor board 30. FIG. 12 and FIG. 13 show the heat exchanger plate 50 in detail. The heat exchanger plate 50 is positioned on the semiconductor board 30, and is thus coupled to the semiconductor board 30 in a large-surface thermally-conductive manner. The heat exchanger plate 50 further incorporates a plurality of capacitor contact sections 51, which are coupled to the capacitors 21 on the capacitor board 20, radially to the stacking direction 11, in a thermally-conductive manner. The capacitors 21, radially to the stacking direction 11, thus engage with the respective capacitor contact sections 51 on the heat exchanger plate 50, and are displaceable on the heat exchanger plate 50 in the stacking direction 11. In this manner, the capacitors 21 remain mechanically dissociated from the heat exchanger plate 50, and the contact pins of the capacitors 21 with the capacitor board 20 are protected from any vibrations or oscillations occurring during the operation of the electric power inverter 10. The semiconductor board 30, and the capacitors 21 on the capacitor board 20 are further coupled to the heat exchanger plate 50 by means of a heat-conducting layer 52—preferably by means of a thermal interface material—in a thermally-conductive manner, as represented in FIG. 3.

The stack formation 12 further incorporates a pressure plate 60, which is screwed to the heat exchanger plate 50 by means of pressure screws 61. A corresponding sectional view of the electric power inverter 10 is represented in FIG. 3. The pressure plate 60 and the heat exchanger plate 50 clamp the capacitor board 20 and the semiconductor board 30 in the stacking direction 11. The pressure plate 60 is arranged with a clearance to the semiconductor board 30, by means of a stop rim 44, which is formed around the screw opening 45 provided in the busbar guide plate 40 for the respective pressure screw 61, and penetrates the capacitor board 20. Between the pressure plate 60 and the capacitor board 20, which is arranged with a clearance to the pressure plate 60, a damping plate 70 is stacked in the stack formation 12, in the stacking direction 11, which reduces vibrations in the stack formation 12 and relative movements between the pressure plate 60, the capacitor board 20 and the semiconductor board 30. By means of the damping plate 70, moreover, the capacitor board 20 and the semiconductor board 30 are compressed together in the stacking direction 11, and are maintained in pressurized contact by the connecting busbars 41. The capacitors 21 thus remain exclusively mechanically coupled to the capacitor board 20 such that, independently of the pressure generated by vibrations or oscillations occurring during the operation of the electric power inverter 10, the—generally soldered—contact pins of the capacitors 21 on the capacitor board 20 are protected against breakage. A control board 80 is further arranged on the pressure plate 60, in the stacking direction 11. The control board 80 controls the electric power inverter 10, and can be connected to an external component via a line terminal 81, as represented in FIG. 2, for the purposes of signal transmission.

The electric power inverter 10 can be externally supplied with a direct current via the positive pole terminal 25 and the negative pole terminal 26 of the capacitor circuit 24. According to FIG. 1, to this end, the positive pole terminal 25 and the negative pole terminal 26 are respectively brought out to the exterior by means of a power terminal stud 28, in the stacking direction 11, averted from the semiconductor board 30. The respective power terminal studs 28 thus penetrate the stack formation 12—i.e. the damping plate 70, the pressure plate 60 and the control board 80—via a respective power terminal opening 29.

Figure 7:
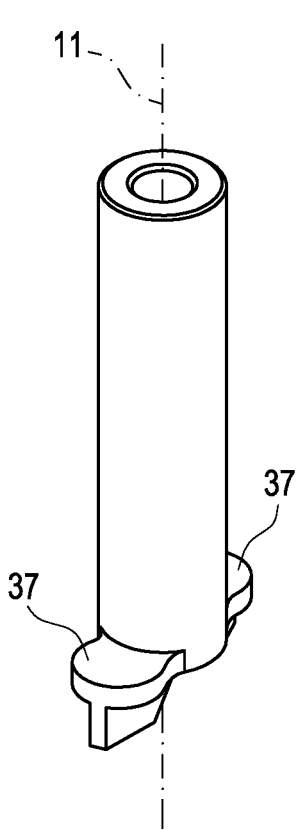
FIGS. 7 and 8 show views of a phase terminal stud in an electric power inverter in the first embodiment.
Figure 8:
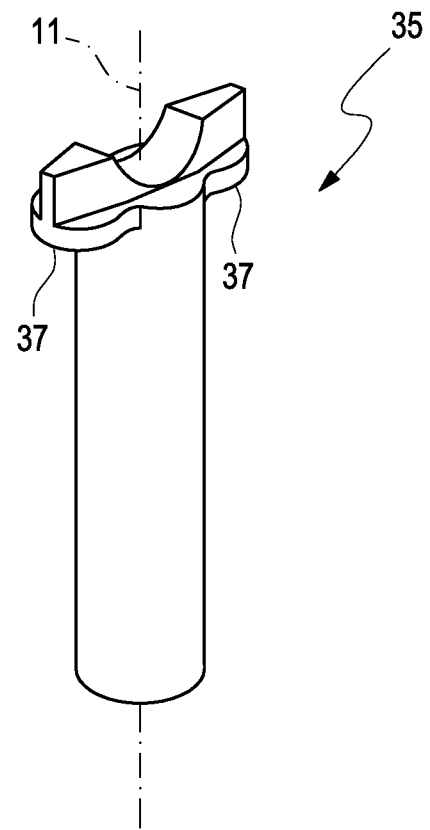

An alternating current generated in the electric power inverter 10 can be tapped-off via the phase terminals 33 which, according to FIG. 1, are respectively brought out to the exterior by means of a phase terminal stud 35, in the stacking direction 11, facing the capacitor board 20. The phase terminal studs 35 thus penetrate the stack formation 12—i.e. the busbar guide plate 40, the capacitor board 20, the damping plate 70, the pressure plate 60 and the control board 80—via a respective phase terminal opening 36. The respective phase terminal stud 35 further incorporates a limit stop 37, perpendicularly to the stacking direction 11 and integrally formed on the phase terminal stud 35, as also represented in FIG. 7 and FIG. 8. The limit stop 37 is arranged between the capacitor board 20 and the semiconductor board 30, and supports the capacitor board 20. To this end, the limit stop 37 is designed such that an area of the capacitor board 20 which incorporates the respective phase terminal opening 36 lies in contact with the limit stop 37.

In order to protect the stack formation 12 from external influences, the latter is enclosed by means of an electrically-insulating housing cover 90 to the level of the heat exchanger plate 50, and is screwed to the heat exchanger plate 50 by means of screws 91, as shown in FIG. 1 and FIG. 2. The housing cover 90 incorporates a total of five terminal openings 92 for the phase terminal studs 35 and for the power terminal studs 28. The housing cover 90 further incorporates a line terminal opening 93 for the line terminal 81 of the control board 80. For the purposes of pressure equalization, the housing cover 90 can additionally incorporate a pressure equalization opening with a membrane, preferably of polytetrafluoroethylene.

The assembled electric power inverter 10 is represented in FIG. 2. Fixing openings 13 are also visible here, by means of which the electric power inverter 10 can be radially or axially attached to an electrical machine, which is not represented here. The electrical machine is suitable for use in an electrically powered drive system, and can be a permanently-excited or externally-excited synchronous machine, an asynchronous machine or another type of electrical machine. The electrical machine can be for example an electrical pump, an electrical compressor, an electrical powered steering and so on.

FIG. 3 shows a sectional view of the stack formation 12—in this case without the control board 80—on the heat exchanger plate 50. In this case, the pressure plate 60 is screwed to the heat exchanger plate 50 by means of the pressure screws 61. The capacitor board 20, the semiconductor board 30, the busbar guide plate 40 and the damping plate 70 are clamped between the pressure plate 60 and the heat exchanger plate 50. By means of the damping plate 70, a pressure is generated between the capacitor board 20 and the semiconductor board 30, and pressure contact is maintained between the capacitor board 20 and the semiconductor board 30 by means of the connecting busbars 41.

FIG. 4 shows the capacitor board 20, on a side facing the semiconductor board 30, and FIG. 5 shows the capacitor board 20 on a side which is averted from the semiconductor board 30. The capacitor board 20 incorporates the plurality of capacitors 21 which constitute the capacitor circuit 24, and are arranged in the edge region 22 of the capacitor board 20. The capacitors 21 are arranged in the stacking direction 11, and delimit the location space 23 for the semiconductor board 30, radially to the stacking direction 11. Via the positive pole terminal 25 and the negative pole terminal 26, the capacitor board 20 can be supplied with a direct current, and is electrically bonded to the semiconductor board 20 by means of the busbar terminals 27.

FIG. 6 shows the semiconductor board 30, on a side facing the capacitor board 20. The semiconductor board incorporates the plurality of power semiconductors 31 which constitute the power circuit 32, with the three phase terminals 33. Via the phase terminals 33, an alternating current can be tapped off from the semiconductor board 30, and the semiconductor board can be electrically bonded to the capacitor board 20 by means of the busbar terminals 34.

FIG. 7 and FIG. 8 represent one of the identically configured phase terminal studs 35, by means of which the respective phase terminal 33, not represented here, is brought out to the exterior. The phase terminal stud 35 incorporates a limit stop 37, which can support the capacitor board 20 on the semiconductor board 30.

FIG. 9 represents one of the identically configured connecting busbars 41. The respective connecting busbar 41 provides mutual electrical bonding of the capacitor board 20 and the semiconductor board 30, and maintains the mutual clearance between the latter in the stack formation 11. Additionally there are specially shaped notches—so called Poke-Yoke—on both sides of the busbars 41 which prevent incorrect busbar assembly into the guide plate 40.

FIG. 10 shows the busbar guide plate 40 on a side facing the capacitor board 20, and FIG. 11 shows the busbar guide plate 40 on a side facing the semiconductor board 30. The busbar guide plate 40 incorporates phase terminal openings 36 for the respective phase terminal studs 35, slot openings 42 for the respective connecting busbars 41, and the screw openings 45 for the respective pressure screws 61. Supporting edges 43 are formed around the slot openings 42, which are oriented in the stacking direction 11 and can support the respective connecting busbars 41 on both sides, perpendicularly to the stacking direction 11. Moreover, around the screw openings 45 on the side facing the capacitor board 20, stop rims 44 are formed, which maintain the clearance of the pressure plate 60 to the semiconductor board 30.

FIG. 12 shows the heat exchanger plate 50 on a side facing the semiconductor board 30, and FIG. 13 shows the heat exchanger plate 50 on an outer side 53 which is averted from the semiconductor board 30. On the side facing the semiconductor board 30, the heat exchanger plate 50 incorporates a plurality of capacitor contact sections 51, to which the capacitors 21 are coupled in a thermally-conductive manner.

In summary, in the electric power inverter 10, the capacitors 21 on the capacitor board 20 are mechanically dissociated from the stack formation 12, such that no relative movements in the stack formation 12 are transmitted to the capacitors 21. The—generally soldered, and thus rigid and brittle—contact pins of the capacitors 21 with the capacitor board 20 are protected against breakage, and any failure of the contact pins is advantageously prevented. Moreover, the capacitors 21 and the power semiconductors 31 can be effectively cooled by means of the heat exchanger plate 50, and any overheating of the electric power inverter 10 can be prevented. The electric power inverter 10 moreover has a reduced structural height, and can be fitted to an electrical machine, which is not represented here, in a space-saving manner.

Figure 14:
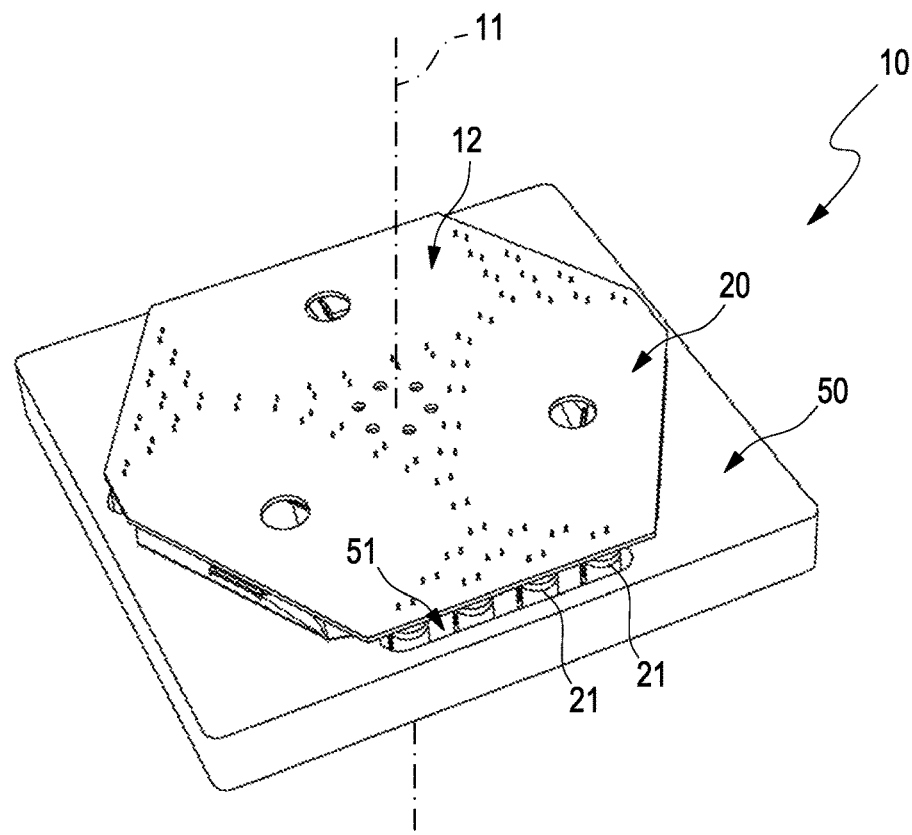
FIG. 14 shows a view of an electric power inverter according to the invention in a second embodiment.
Figure 15:
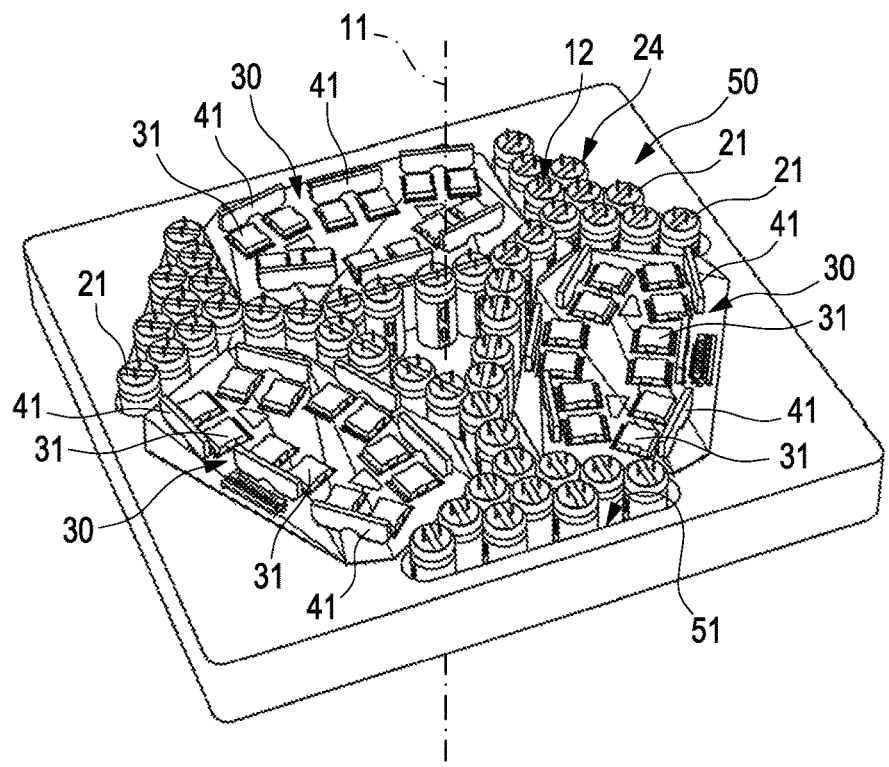
FIG. 15 shows a view of capacitors and the semiconductor boards arranged in a heat exchanger plate, in the electric power inverter in the second embodiment.
Figure 16:
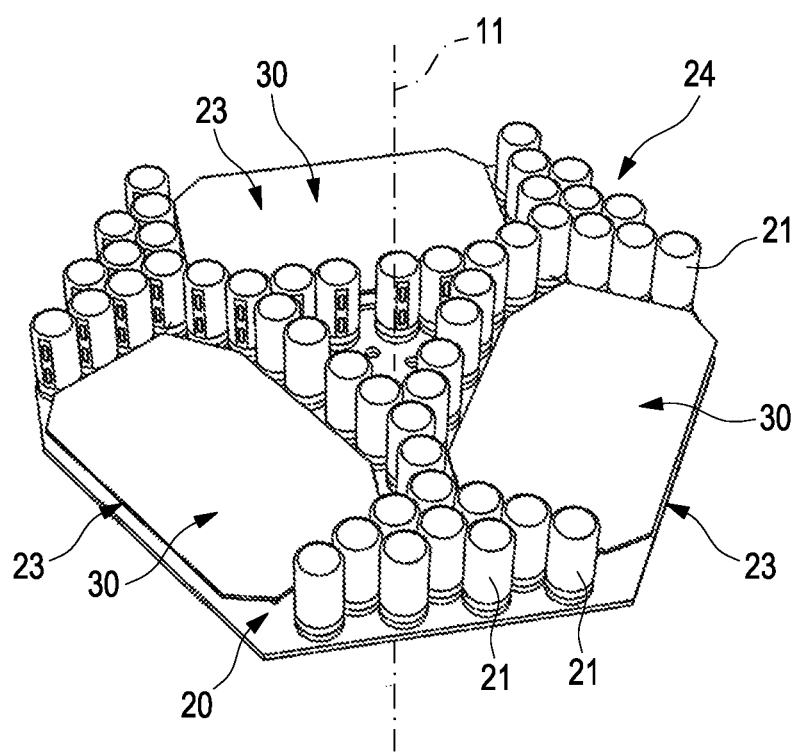
FIG. 16 shows a view of a capacitor board with a plurality of capacitors and semiconductor boards, in the electric power inverter in the second embodiment.
Figure 17:
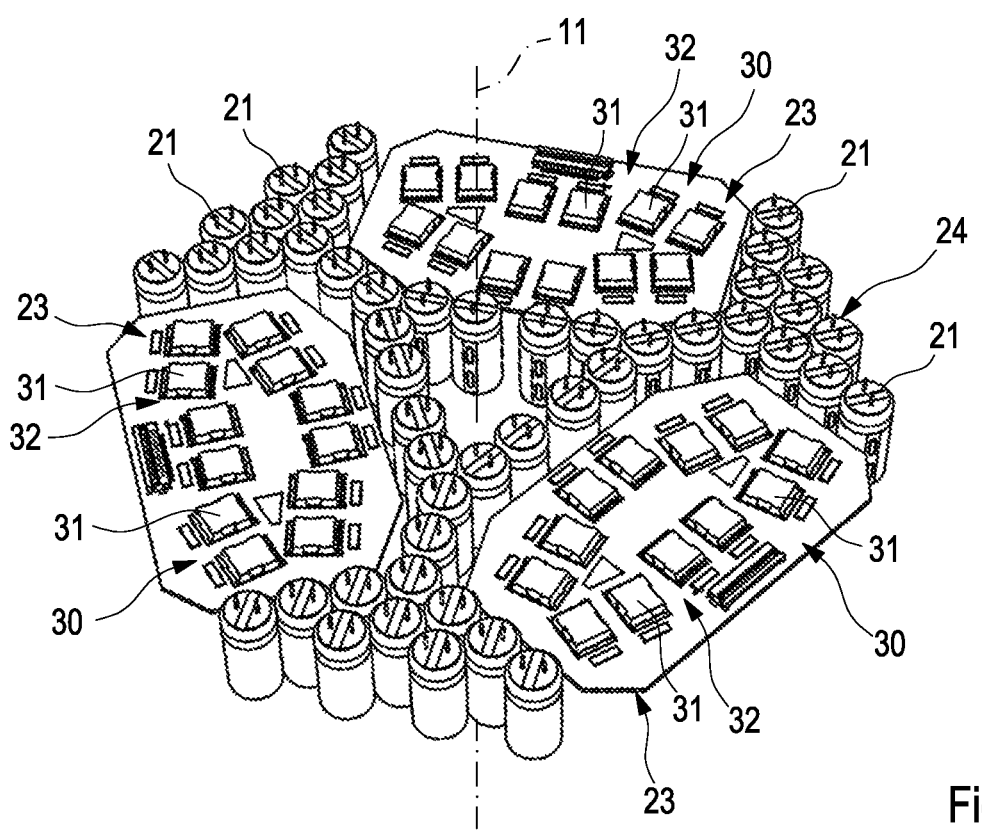
FIG. 17 shows a view of capacitors and the semiconductor boards, in an electric power inverter in the second embodiment.

FIG. 14 shows a view of the electric power inverter 10 according to the invention in a second embodiment. FIG. 15 shows a view of the capacitors 21 and the semiconductor boards 30 arranged in the heat exchanger plate 50. FIG. 16 shows a view of the capacitor board 20 with the capacitors 21 and the semiconductor boards 30. FIG. 17 shows a view of the capacitors 21 and the semiconductor boards 30. In difference to first embodiment, the electric power inverter 10 contains here three semiconductor boards 30. The capacitors 21 form the open location spaces 23 for the respective semiconductors boards 30. Otherwise, the second embodiment in FIG. 14 to FIG. 17 corresponds to the first embodiment shown in FIG. 1 to FIG. 13.

The invention claimed is:

1. An electric power inverter for an electrical machine of an electrically powered drive system, comprising:
    a capacitor board including a plurality of capacitors, and at least one semiconductor board including a plurality of power semiconductors;
    the capacitor board and the at least one semiconductor board electrically interconnected and mutually stacked in a stacking direction, with a clearance, in a stack formation;
    the plurality of capacitors arranged on the capacitor board in the stacking direction and fitted to a side thereof facing the at least one semiconductor board;
    wherein the plurality of capacitors are arranged on the capacitor board such that at least one open location space is defined between the plurality of capacitors and the capacitor board, the at least one open location space configured to accommodate the at least one semiconductor board;
    wherein the at least one semiconductor board is arranged within the at least one open location space with a clearance to the capacitor board;
    wherein a control board is stacked in the stack formation in the stacking direction; and
    wherein the control board is arranged on the capacitor board on a side opposite the at least one semiconductor board.

2. The electric power inverter according to claim 1, wherein at least one of:
    the plurality of capacitors are arranged in an edge region of the capacitor board;
    a maximum width of the at least one semiconductor board is smaller than a difference between a width of the capacitor board and two times a width of an individual capacitor of the plurality of capacitors; and
    a maximum length of the at least one semiconductor board is smaller than a difference between a length of the capacitor board and two times a length of an individual capacitor of the plurality of capacitors.

3. The electric power inverter according to claim 1, wherein:
    the capacitor board and the at least one semiconductor board are mutually electrically bonded via at least two connecting busbars; and
    the at least two connecting busbars are arranged in the at least one open location space between the capacitor board and the at least one semiconductor board, and maintain the clearance between the capacitor board and the at least one semiconductor board.

4. The electric power inverter according to claim 3, further comprising an electrically-insulating busbar guide plate stacked in the stack formation in the stacking direction and arranged in the at least one open location space adjacent to the capacitor board and the at least one semiconductor board, wherein the at least two connecting busbars are fitted to the busbar guide plate, perpendicularly to the stacking direction and the busbar guide plate, in a penetrative manner.

5. The electric power inverter according to claim 1, wherein:
the plurality of power semiconductors on the at least one semiconductor board define a power circuit with at least one phase terminal which, via a phase terminal stud, extends to the capacitor board in the stacking direction and extends out to an exterior through the stack formation; and
the phase terminal stud penetrates the stack formation through a phase terminal opening.

6. The electric power inverter according to claim 5, wherein the phase terminal stud includes, perpendicularly to the stacking direction, a limit stop integrally arranged on the phase terminal stud and disposed between the capacitor board and the at least one semiconductor board, and wherein the limit stop is disposed on the capacitor board, with a clearance to the at least one semiconductor board, in an area of the phase terminal opening.

7. The electric power inverter according to claim 1, wherein:
the plurality of capacitors on the capacitor board define a capacitor circuit with a positive pole terminal and a negative pole terminal which, via a respective power terminal stud extending away from the at least one semiconductor board in the stacking direction, extend out to an exterior through the stack formation; and
the respective power terminal stud penetrates the stack formation through an associated power terminal opening.

8. The electric power inverter according to claim 1, further comprising a thermally-conductive heat exchanger plate arranged on the at least one semiconductor board on a side opposite the capacitor board.

9. The electric power inverter according to claim 8, wherein at least one of:
the at least one semiconductor board is coupled to the heat exchanger plate in a large-surface thermally-conductive manner; and
the plurality of capacitors on the capacitor board are coupled to the heat exchanger plate in a thermally-conductive manner, the heat exchanger plate including a plurality of capacitor contact sections coupled to a respective capacitor of the plurality of capacitors radially to the stacking direction.

10. The electric power inverter according to claim 9, wherein at least one of i) the at least one semiconductor board and ii) the plurality of capacitors on the capacitor board are coupled to the heat exchanger plate in a thermally-conductive manner via a heat-conducting layer.

11. The electric power inverter according to claim 8, wherein the plurality of capacitors on the capacitor board are axially coupled to the heat exchanger plate via an elastic layer.

12. The electric power inverter according to claim 8, wherein the heat exchanger plate has an outer side facing away from the at least one semiconductor board, and wherein at least one of:
the heat exchanger plate includes a plurality of cooling ribs disposed on the outer side of the heat exchanger plate; and
a cooling device is coupled to the outer side of the heat exchanger plate in a thermally-conductive manner, and the heat exchanger plate is coolable via a cooling medium conveyed in the cooling device.

13. The electric power inverter according to claim 8, wherein the heat exchanger plate is defined by one of i) a portion of a housing of the electrical machine, and ii) a portion of the electrical machine.

14. The electric power inverter according to claim 8, further comprising a pressure plate stacked in the stack formation in the stacking direction, wherein:
the pressure plate is arranged on the capacitor board on a side opposite the at least one semiconductor board; and
the capacitor board and the at least one semiconductor board are clamped between the pressure plate and the heat exchanger plate in the stacking direction.

15. The electric power inverter according to claim 14, further comprising an elastic damping plate stacked in the stack formation in the stacking direction, wherein:
the damping plate is arranged between the pressure plate and the capacitor board; and
the capacitor board and the at least one semiconductor board are compressed together in the stacking direction via the pressure plate, the damping plate, and the heat exchanger plate, and mutually electrically bonded via pressure contact.

16. The electric power inverter according to claim 8, further comprising an electrically-insulating housing cover detachably arranged on the heat exchanger plate enclosing the stack formation to a level of the heat exchanger plate.

17. The electric power inverter according to claim 16, wherein at least one of:
the housing cover includes a plurality of terminal openings respectively configured to receive at least one of i) a phase terminal stud of a power circuit defined by the plurality of power semiconductors and ii) a respective power terminal stud of a plurality of power terminal studs of a capacitor circuit defined by the plurality of capacitors;
the housing cover includes a line terminal opening configured to receive a line terminal for transmission of signals between the control board and an external component; and
the housing cover includes a pressure equalization opening having a membrane.

18. The electric power inverter according to claim 1, wherein the electric power inverter is one of radially and axially arranged on the electrical machine.

19. An electrical machine, comprising a body and an electric power inverter one of axially and radially arranged on the body, wherein the electric power inverter includes:
a capacitor board including a plurality of capacitors, and at least one semiconductor board including a plurality of power semiconductors;
the capacitor board and the at least one semiconductor board electrically interconnected and mutually stacked in a stacking direction, with a clearance, in a stack formation;
the plurality of capacitors arranged on the capacitor board in the stacking direction and fitted to a side thereof facing the at least one semiconductor board;
wherein the plurality of capacitors are arranged on the capacitor board such that at least one open location space is defined between the plurality of capacitors and the capacitor board, the at least one open location space configured to accommodate the at least one semiconductor board;

wherein the at least one semiconductor board is arranged within the at least one open location space with a clearance to the capacitor board;

the capacitor board and the at least one semiconductor board are mutually electrically bonded via at least two connecting busbars; and the at least two connecting busbars are arranged in the at least one open location space between the capacitor board and the at least one semiconductor board, and maintain the clearance between the capacitor board and the at least one semiconductor board.

20. An electric power inverter for an electrical machine of an electrically powered drive system, comprising a capacitor board including a plurality of capacitors, at least one semiconductor board including a plurality of power semiconductors, a pressure plate, and a thermally-conductive heat exchanger plate, wherein:

the capacitor board and the at least one semiconductor board are electrically interconnected and mutually stacked in a stacking direction, with a clearance, in a stack formation;

the plurality of capacitors are arranged on the capacitor board in the stacking direction and fitted to a side thereof facing the at least one semiconductor board;

the plurality of capacitors are arranged on the capacitor board such that at least one open location space is defined between the plurality of capacitors and the capacitor board, the at least one open location space configured to accommodate the at least one semiconductor board;

the at least one semiconductor board is arranged within the at least one open location space with a clearance to the capacitor board;

the heat exchanger plate is arranged on the at least one semiconductor board on a side opposite the capacitor board;

the pressure plate is stacked in the stack formation in the stacking direction and is arranged on the capacitor board on a side opposite the at least one semiconductor board; and the capacitor board and the at least one semiconductor board are clamped between the pressure plate and the heat exchanger plate in the stacking direction.

\* \* \* \* \*